United States Patent
Yantchev et al.

(10) Patent No.: US 11,689,185 B2
(45) Date of Patent: *Jun. 27, 2023

(54) SOLIDLY-MOUNTED TRANSVERSELY-EXCITED FILM BULK ACOUSTIC RESONATOR WITH RECESSED INTERDIGITAL TRANSDUCER FINGERS USING ROTATED Y-X CUT LITHIUM NIOBATE

(71) Applicant: Murata Manufacturing Co., Ltd., Nagaokakyo (JP)

(72) Inventors: Ventsislav Yantchev, Sofia (BG); Viktor Plesski, Gorgier (CH); Bryant Garcia, Belmont, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 150 days.

This patent is subject to a terminal disclaimer.

(21) Appl. No.: 17/207,326

(22) Filed: Mar. 19, 2021

(65) Prior Publication Data
US 2021/0273632 A1  Sep. 2, 2021

Related U.S. Application Data

(63) Continuation of application No. 16/941,458, filed on Jul. 28, 2020, now Pat. No. 11,146,244, which is a
(Continued)

(51) Int. Cl.
*H03H 9/56* (2006.01)
*H03H 9/02* (2006.01)
(Continued)

(52) U.S. Cl.
CPC ........ *H03H 9/568* (2013.01); *H03H 9/02015* (2013.01); *H03H 9/02031* (2013.01);
(Continued)

(58) Field of Classification Search
CPC ........ H03H 9/02015; H03H 3/02; H03H 9/13; H03H 9/54
(Continued)

(56) References Cited

U.S. PATENT DOCUMENTS

| 5,446,330 A | 8/1995 | Eda et al. |
| 5,552,655 A | 9/1996 | Stokes et al. |

(Continued)

FOREIGN PATENT DOCUMENTS

| JP | 2013214954 A | 10/2013 |
| JP | 2018093487 A | 6/2018 |

(Continued)

OTHER PUBLICATIONS

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

(Continued)

*Primary Examiner* — Hafizur Rahman
(74) *Attorney, Agent, or Firm* — ArentFox Schiff LLP

(57) ABSTRACT

Acoustic resonator devices, filters, and methods are disclosed. An acoustic resonator includes a substrate, a lithium niobate plate having front and back surfaces, wherein Euler angles of the lithium niobate plate are [0°, β, 0°], where β is greater than or equal to 0° and less than or equal to 60°, and an acoustic Bragg reflector between the surface of the substrate and the back surface of the lithium niobate plate. An interdigital transducer (IDT) is formed on the front surface of the piezoelectric plate. At least one finger of the IDT is disposed in a groove in the lithium niobate plate.

21 Claims, 13 Drawing Sheets

DETAIL C

Related U.S. Application Data continuation of application No. 16/782,971, filed on Feb. 5, 2020, now Pat. No. 10,790,802, which is a continuation-in-part of application No. 16/689,707, filed on Nov. 20, 2019, now Pat. No. 10,917,070, which is a continuation-in-part of application No. 16/438,141, filed on Jun. 11, 2019, now Pat. No. 10,601,392, which is a continuation-in-part of application No. 16/230,443, filed on Dec. 21, 2018, now Pat. No. 10,491,192, said application No. 16/689,707 is a continuation of application No. 16/230,443, filed on Dec. 21, 2018, now Pat. No. 10,491,192.

(60) Provisional application No. 62/904,133, filed on Sep. 23, 2019, provisional application No. 62/818,564, filed on Mar. 14, 2019, provisional application No. 62/753,815, filed on Oct. 31, 2018, provisional application No. 62/753,809, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/13* (2006.01)
*H03H 9/17* (2006.01)
*H03H 3/02* (2006.01)
*H10N 30/87* (2023.01)

(52) U.S. Cl.
CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H03H 3/02* (2013.01); *H03H 9/02039* (2013.01); *H03H 2003/023* (2013.01); *H10N 30/877* (2023.02)

(58) Field of Classification Search
USPC .......................................... 333/186, 187, 189
See application file for complete search history.

(56) References Cited

U.S. PATENT DOCUMENTS

| | | | |
|---|---|---|---|
| 5,726,610 A | 3/1998 | Allen et al. | |
| 5,853,601 A | 12/1998 | Krishaswamy | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,707,229 B1 | 3/2004 | Martin | |
| 6,710,514 B2 | 3/2004 | Ikada et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,939,987 B1 | 5/2011 | Solal et al. | |
| 7,941,103 B2 | 5/2011 | Iwamoto et al. | |
| 8,278,802 B1 | 10/2012 | Lee et al. | |
| 8,294,330 B1 | 10/2012 | Abbott et al. | |
| 8,344,815 B2 | 1/2013 | Yamanaka | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahas | |
| 9,130,145 B2 | 9/2015 | Martin et al. | |
| 9,219,466 B2 | 12/2015 | Meltaus et al. | |
| 9,240,768 B2 | 1/2016 | Nishihara et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson et al. | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 * | 10/2017 | Kimura .................. H01L 41/18 |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,819,319 B1 | 10/2020 | Hyde | |
| 10,826,462 B2 | 11/2020 | Plesski et al. | |
| 10,868,512 B2 | 12/2020 | Garcia et al. | |
| 10,917,070 B2 | 2/2021 | Plesski et al. | |
| 10,985,728 B2 | 4/2021 | Plesski | |
| 11,146,231 B2 * | 10/2021 | Plesski .................. H03H 9/13 |
| 11,201,601 B2 | 12/2021 | Yantchev et al. | |
| 2002/0079986 A1 | 6/2002 | Ruby et al. | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0099091 A1 | 5/2005 | Mishima | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2007/0296304 A1 | 12/2007 | Fujii et al. | |
| 2008/0246559 A1 | 10/2008 | Ayazi | |
| 2010/0064492 A1 | 3/2010 | Tanaka | |
| 2010/0123367 A1 | 5/2010 | Tai et al. | |
| 2011/0018389 A1 | 1/2011 | Fukano et al. | |
| 2011/0109196 A1 | 5/2011 | Goto et al. | |
| 2011/0278993 A1 * | 11/2011 | Iwamoto ................ H03H 9/173 |
| | | | 29/25.35 |
| 2012/0286900 A1 | 11/2012 | Kadota et al. | |
| 2013/0207747 A1 | 8/2013 | Nishii et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0145556 A1 | 5/2014 | Kadota | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0244149 A1 | 8/2015 | Van Someren | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0079958 A1 | 3/2016 | Burak | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0201232 A1 | 7/2017 | Nakamura et al. | |
| 2017/0214381 A1 | 7/2017 | Bhattacharjee | |
| 2017/0222622 A1 | 8/2017 | Solal et al. | |
| 2017/0264266 A1 | 9/2017 | Kishimoto | |
| 2017/0290160 A1 | 10/2017 | Takano et al. | |
| 2017/0370791 A1 | 12/2017 | Nakamura et al. | |
| 2018/0005950 A1 | 1/2018 | Watanabe | |
| 2018/0013400 A1 | 1/2018 | Ito et al. | |
| 2018/0026603 A1 | 1/2018 | Iwamoto | |

(56) References Cited

U.S. PATENT DOCUMENTS

| | | |
|---|---|---|
| 2018/0033952 A1 | 2/2018 | Yamamoto |
| 2018/0062617 A1 | 3/2018 | Yun et al. |
| 2018/0123016 A1 | 5/2018 | Gong |
| 2018/0191322 A1 | 7/2018 | Chang et al. |
| 2018/0212589 A1 | 7/2018 | Meltaus et al. |
| 2019/0068155 A1 | 2/2019 | Kimura |
| 2019/0068164 A1 | 2/2019 | Houlden et al. |
| 2019/0123721 A1 | 4/2019 | Takamine |
| 2019/0131953 A1 | 5/2019 | Gong |
| 2019/0207583 A1 | 7/2019 | Miura et al. |
| 2019/0273480 A1 | 9/2019 | Lin et al. |
| 2019/0348966 A1 | 11/2019 | Campanella-Pineda |
| 2020/0021272 A1 | 1/2020 | Segovia Fernandez et al. |
| 2020/0036357 A1 | 1/2020 | Mimura |
| 2020/0235719 A1 | 7/2020 | Yantchev et al. |
| 2020/0295729 A1 | 9/2020 | Yantchev |
| 2020/0304091 A1 | 9/2020 | Yantchev |
| 2021/0328575 A1 | 10/2021 | Hammond et al. |
| 2022/0200567 A1 | 6/2022 | Garcia |

FOREIGN PATENT DOCUMENTS

| | | | |
|---|---|---|---|
| WO | WO-2012137027 A1 * | 10/2012 | ......... H03H 9/02551 |
| WO | 2016017104 | 2/2016 | |
| WO | 2017188342 A1 | 11/2017 | |
| WO | 2018003273 | 1/2018 | |
| WO | 2019138810 A1 | 7/2019 | |
| WO | 2020100744 A1 | 5/2020 | |

OTHER PUBLICATIONS

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, A. Gao et al. "5 Ghz Lithium Niobate MEMS Resonators With High Fom of 153", 2017 IEEE 30th International Conference in Micro Electro Mechanical Systems (MEMS). Jan. 22-26, 2017. pp. 942-945 Jan. 22, 2017.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

G. Manohar, Investigation of Various Surface Acoustic Wave Design Configurations for Improved Sensitivity, Jan. 2012, Doctoral dissertation, University of South Florida, USA Jan. 2012.

Ekeom, D. & Dubus, Bertrand & Volatier, A., Solidly mounted resonator (SMR) FEM-BEM simulation, 2006, 1474-1477, 10.1109/ULTSYM.2006.371. 2006.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreynl, B. Fabrication and Design of Resonant Microdevices Andrew William, Inc. 2018, NY (Year 2008). 2008.

Material Properties of Tibtech Innovations, © 2018 Tibtech Innovations (Year 2018). 2018.

R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190. 2014.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. 2018.

USPTO/ISA, International Search Report and Written Opinion for PCT Application No. PCT/US2019/036433 dated Aug. 29, 2019. 2019.

USPTO/ISA, International Search Report and Written Opinion for PCT Application No. PCT/US2019/058632 dated Jan. 17, 2020. 2020.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi: 10.1002/ecja.4410690406 1986.

Naumenko et al., "Optimal orientations of Lithium Niobate for resonator SAW filters", 2003 IEEE Ultrasonics Symposium—pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

* cited by examiner

SOLIDLY-MOUNTED TRANSVERSELY-EXCITED FILM BULK ACOUSTIC RESONATOR WITH RECESSED INTERDIGITAL TRANSDUCER FINGERS USING ROTATED Y-X CUT LITHIUM NIOBATE

RELATED APPLICATION INFORMATION

This patent is a continuation of application Ser. No. 16/941,458, titled SOLIDLY-MOUNTED TRANSVERSELY EXCITED FILM BULK ACOUSTIC RESONATOR USING ROTATED Y-X CUT LITHIUM NIOBATE, filed Jul. 28, 2020.

Application Ser. No. 16/941,458 is a continuation of application Ser. No. 16/782,971, entitled TRANSVERSELY EXCITED FILM BULK ACOUSTIC RESONATOR USING ROTATED Y-X CUT LITHIUM NIOBATE, filed Feb. 5, 2020, now U.S. Pat. No. 10,790,802, which claims priority to provisional application 62/904,133, entitled WIDE BAND BAW RESONATORS ON 120-130 Y-X LITHIUM NIOBATE SUBSTRATES, filed Sep. 23, 2019. Application Ser. No. 16/782,971 is a continuation-in-part of application Ser. No. 16/689,707, entitled BANDPASS FILTER WITH FREQUENCY SEPARATION BETWEEN SHUNT AND SERIES RESONATORS SET BY DIELECTRIC LAYER THICKNESS, filed Nov. 20, 2019, now U.S. Pat. No. 10,917,070, which is a continuation of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. Application Ser. No. 16/782,971 is also a continuation-in-part of application Ser. No. 16/438,141, filed Jun. 11, 2019, entitled SOLIDLY MOUNTED TRANSVERSELY-EXCITED FILM BULK ACOUSTIC RESONATOR, now U.S. Pat. No. 10,601,392, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192, and claims priority from provisional patent application 62/753,809, filed Oct. 31, 2018, entitled SOLIDLY MOUNTED SHEAR-MODE FILM BULK ACOUSTIC RESONATOR, and provisional patent application 62/818,564, filed Mar. 14, 2019, entitled SOLIDLY MOUNTED XBAR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to filters, oscillators, sensors and other radio frequency devices using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously described element having the same reference designator.

DETAILED DESCRIPTION

Description of Apparatus

Figure 1:
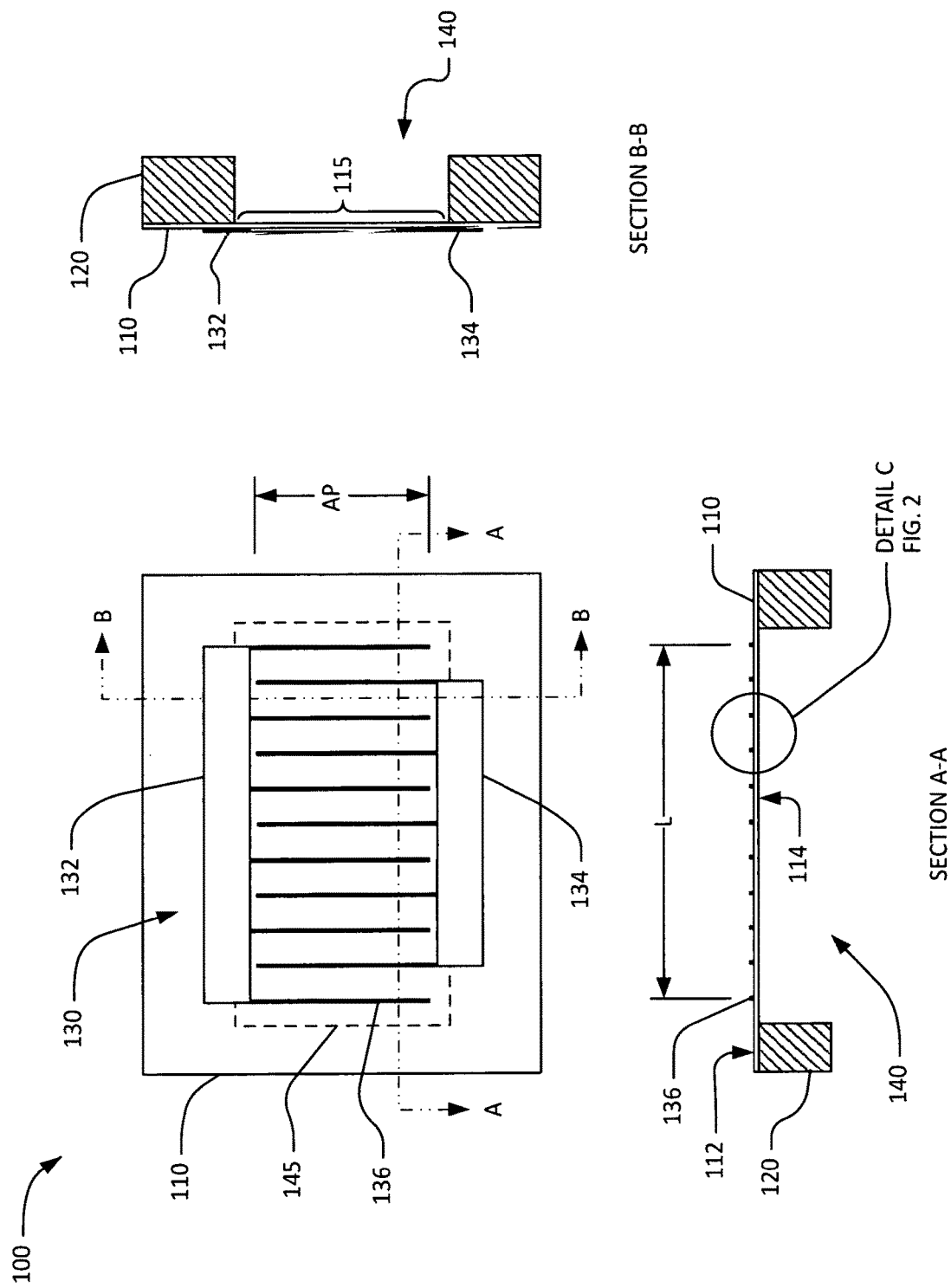
FIG. 1 includes a schematic plan view and two schematic cross-sectional views of a transversely excited film bulk acoustic resonator (XBAR).

FIG. 1 shows a simplified schematic top view and orthogonal cross-sectional views of a transversely excited film bulk acoustic resonator (XBAR) 100. XBARs were first described in application Ser. No. 16/230,443. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having essentially parallel front and back surfaces 112, 114, respectively. The piezoelectric plate is a thin single-crystal layer of lithium niobate. The piezoelectric plate is cut such that the orientation of the X, Y, and Z crystalline axes with respect to the front and back surfaces is known and consistent. In particular, the piezoelectric plate 110 is rotated Z-cut, which is to say the Z crystalline axis is inclined by a small rotation angle relative to the normal to the front and back surfaces 112, 114. As will be discussed in further detail, the small rotation angle is defined by the second Euler angle of the piezoelectric plate.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the cavity 140 is a hole though the substrate 110. In other configurations, the cavity 140 may be a recess in the substrate 120. Also as shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, there may be openings through the piezoelectric plate 110 (for example to allow etching of the cavity beneath the piezoelectric plate). In this case, the diaphragm 115 will be contiguous with the rest of the piezoelectric plate 110 around at least 50% of the perimeter 145 of the cavity.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT, The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates back and forth along a direction substantially orthogonal to the surface of the piezoelectric plate 110, which is also normal, or transverse, to the primary direction of the electric field created between the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
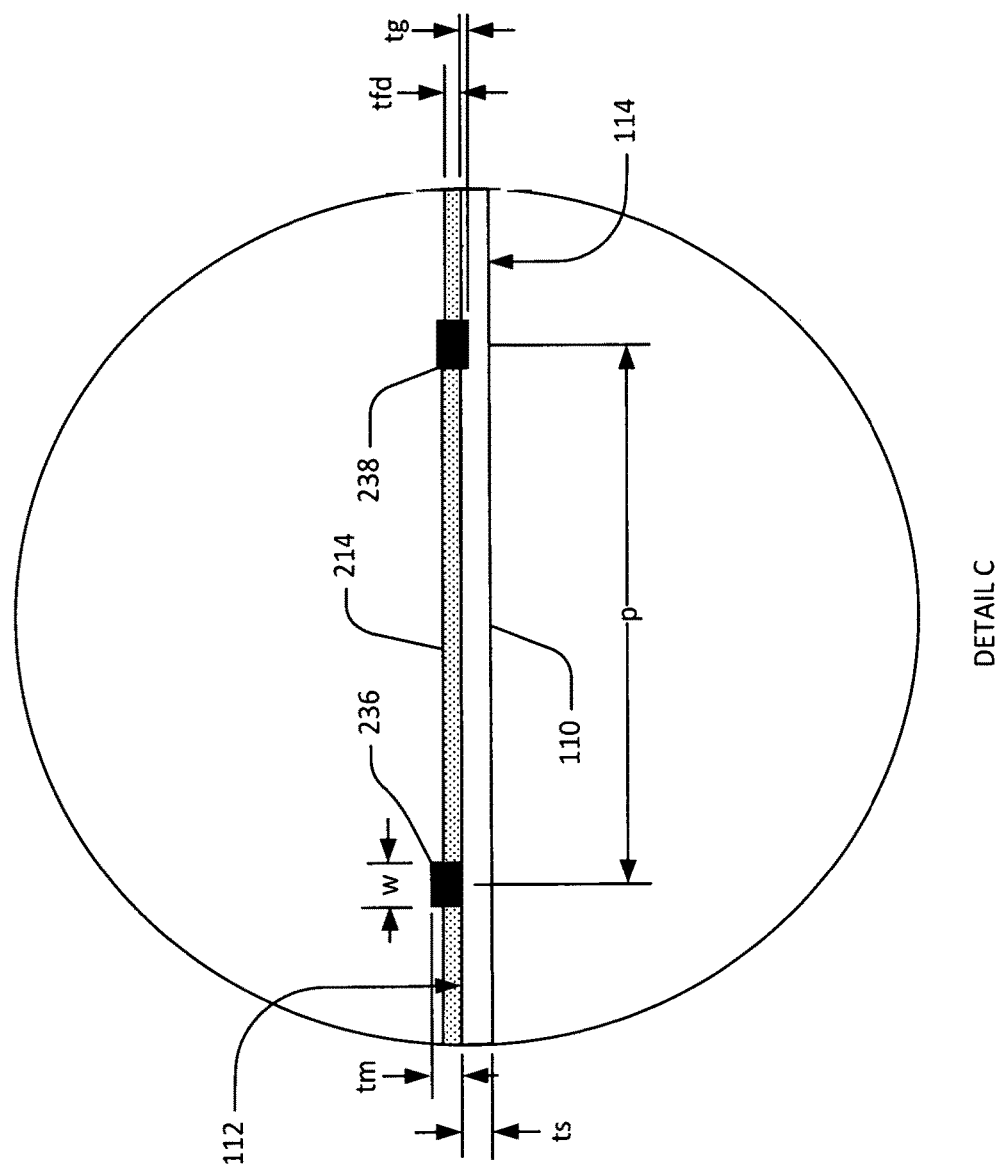
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of Lithium Niobate piezoelectrical material having parallel front and back surfaces 112, 114 and a thickness ts. ts may be, for example, 100 nm to 1500 nm. When used in filters for LTE™ bands from 3.4 GHZ to 6 GHz (e.g. LTE™ bands 42, 43, 46), the thickness ts may be, for example, 300 nm to 700 nm.

The IDT fingers, such as IDT finger 236, may be disposed on the front surface 112 of the piezoelectric plate 110. Alternatively, IDT fingers, such as IDT finger 238, may be disposed in grooves formed in the front surface 112. The IDT fingers 236, 238 may be aluminum, substantially aluminum alloys, copper, substantially copper alloys, beryllium, gold, tungsten, molybdenum or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the wavelength of the horizontally-propagating surface acoustic wave at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric plate 112. The width of the IDT fingers in an XBAR is not constrained to one-fourth of the acoustic wavelength at resonance. For example, the width of XBAR IDT fingers may be 500 nm or greater, such that the IDT can be fabricated using optical lithography.

The thickness tm of the IDT fingers may be from 100 nm to about equal to the width w. The thickness of the busbars (132, 134 in FIG. 1) of the IDT may be the same as, or greater than, the thickness tm of the IDT fingers. The depth tg of the grooves formed in the front surface may be less than (as shown in FIG. 2), equal to, or greater than tm, but not greater than ts A front-side dielectric layer 214 may optionally be formed on the front surface 112 of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236, 238. Although not shown in FIG. 2, the front side dielectric layer 214 may also be deposited over the IDT fingers 238. The front-side dielectric layer 214 may be a non-piezoelectric dielectric material, such as silicon dioxide or silicon nitride. tfd may be, for example, 0 to 500 nm. tfd is typically less than the thickness ts of the piezoelectric plate. The front-side dielectric layer 214 may be formed of multiple layers of two or more materials. The front-side dielectric layer may be deposited, for example by evaporation, sputtering, chemical vapor deposition, or some other technique.

Figure 3:
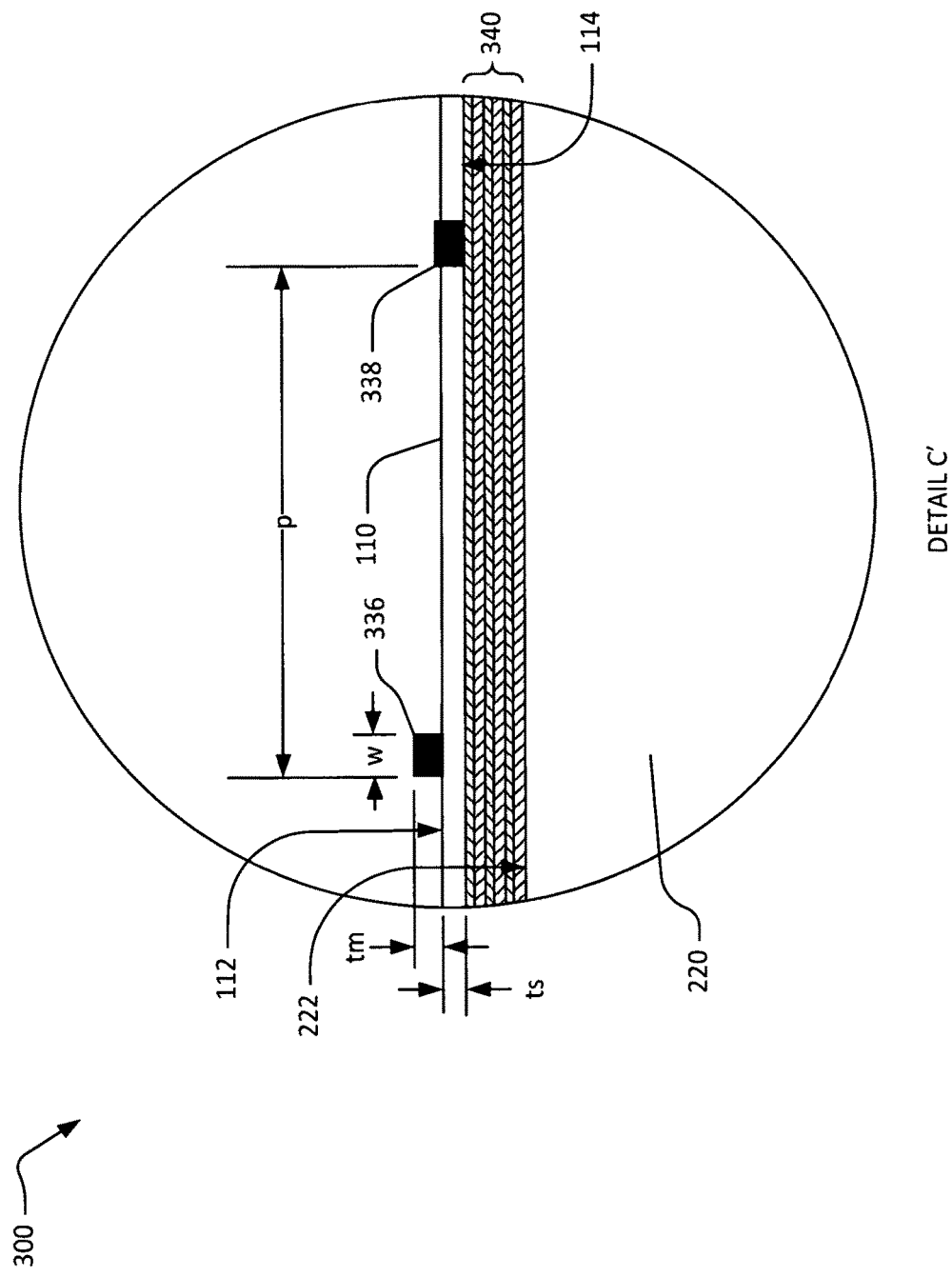
FIG. 3 is an alternative expanded schematic cross-sectional view of an XBAR.

FIG. 3 shows a detailed schematic cross-sectional view of a solidly mounted XBAR (SM XBAR) 300. SM XBARs were first described in U.S. Pat. No. 10,601,392. The SM XBAR 300 includes a piezoelectric plate 110, an IDT (of which only fingers 336, 338 are visible) and an optional front-side dielectric layer 214 as previously described. The piezoelectric layer 110 has parallel front and back surfaces 112, 114. Dimension ts is the thickness of the piezoelectric plate 110. The width of the IDT fingers 336, 338 is dimension w, thickness of the IDT fingers is dimension tm, and the IDT pitch is dimension p. The thickness of the front-side dielectric layer 214 is dimension tfd.

In contrast to the XBAR devices shown in FIG. 1 and FIG. 2, the IDT of an SM XBAR is not formed on a diaphragm spanning a cavity in the substrate 120. Instead, an acoustic Bragg reflector 340 is sandwiched between a surface 222 of the substrate 220 and the back surface 114 of the piezoelectric plate 110. The term "sandwiched" means the acoustic Bragg reflector 340 is both disposed between and mechanically attached to a surface 222 of the substrate 220 and the back surface 114 of the piezoelectric plate 110. In some circumstances, thin layers of additional materials may be disposed between the acoustic Bragg reflector 340 and the surface 222 of the substrate 220 and/or between the Bragg reflector 340 and the back surface 114 of the piezoelectric plate 110. Such additional material layers may be present, for example, to facilitate bonding the piezoelectric plate 110, the acoustic Bragg reflector 340, and the substrate 220.

The acoustic Bragg reflector 340 includes multiple dielectric layers that alternate between materials having high acoustic impedance and materials have low acoustic impedance. The acoustic impedance of a material is the product of the material's shear wave velocity and density. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each layer of the acoustic Bragg reflector 340 has a thickness equal to, or about, one-fourth of the wavelength in the layer of a shear bulk wave having the same polarization as the primary acoustic mode at or near a resonance frequency of the SM XBAR 300. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide. All of the high acoustic impedance layers of the acoustic Bragg reflector 340 are not necessarily the same material, and all of the low acoustic impedance layers are not necessarily the same material. In the example of FIG. 3, the acoustic Bragg reflector 340 has a total of six layers. An acoustic Bragg reflector may have more than, or less than, six layers.

The IDT fingers, such as IDT finger 336, may be disposed on the front surface 112 of the piezoelectric plate 110. Alternatively, IDT fingers, such as IDT fingers 238 in FIGS. 2 and 338 in FIG. 3, may be disposed in groves formed in the front surface 112. The grooves may extend partially through the piezoelectric plate, as shown in FIG. 2. Alternatively, the grooves may extend completely through the piezoelectric plate as shown in FIG. 3.

Figure 4:
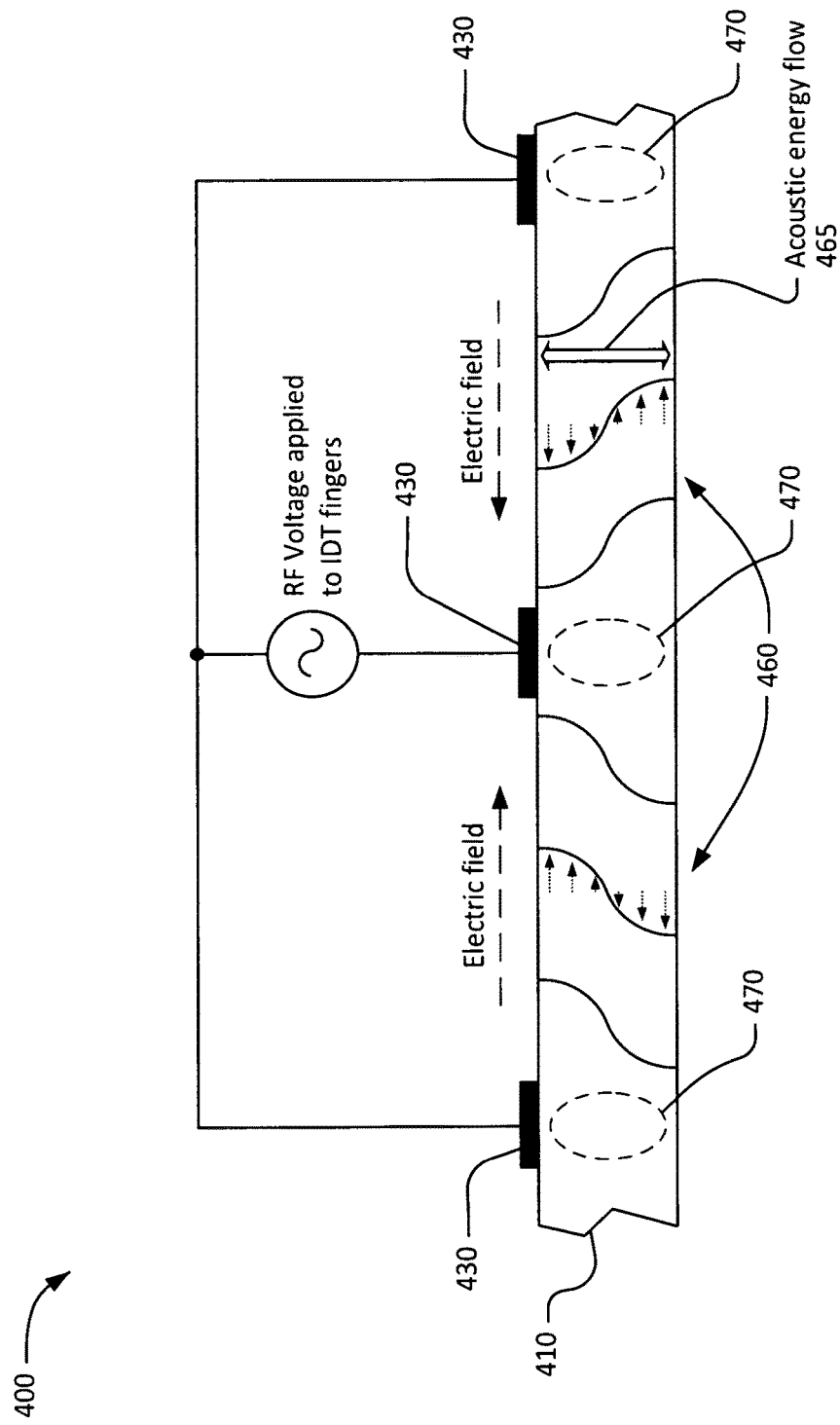
FIG. 4 is a graphic illustrating a shear horizontal acoustic mode in an XBAR.

FIG. 4 is a graphical illustration of the primary acoustic mode in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the electric energy is highly concentrated in the plate relative to the air. The lateral electric field introduces shear deformation, and thus strongly excites a shear-mode acoustic mode, in the piezoelectric plate 410. In this context, "shear deformation" is defined as deformation in which atomic displacements are horizontal but vary in a vertical direction. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and magnitude of physical motion of the piezoelectric media. The degree of physical motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

In an SM XBAR, as shown in FIG. 3, the motion distribution in the piezoelectric plate is similar. However, the thickness of the plate is not necessarily close to one-half of the wavelength of the primary acoustic mode, and some part of acoustic energy is localized in the Bragg stack, in shear vibrations with amplitude exponentially decaying in the depth of the stack.

Considering FIG. 4, there is essentially no horizontal electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the metal IDT fingers 430 is low (for example compared to the fingers of an IDT in a SAW resonator), which reduces viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. This compression/ extension of the elastic media is responsible for additional adiabatic loss mechanism absent for pure shear waves. In addition, the strongest coupling in lithium niobate and lithium tantalate corresponds to the shear deformations. Thus, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
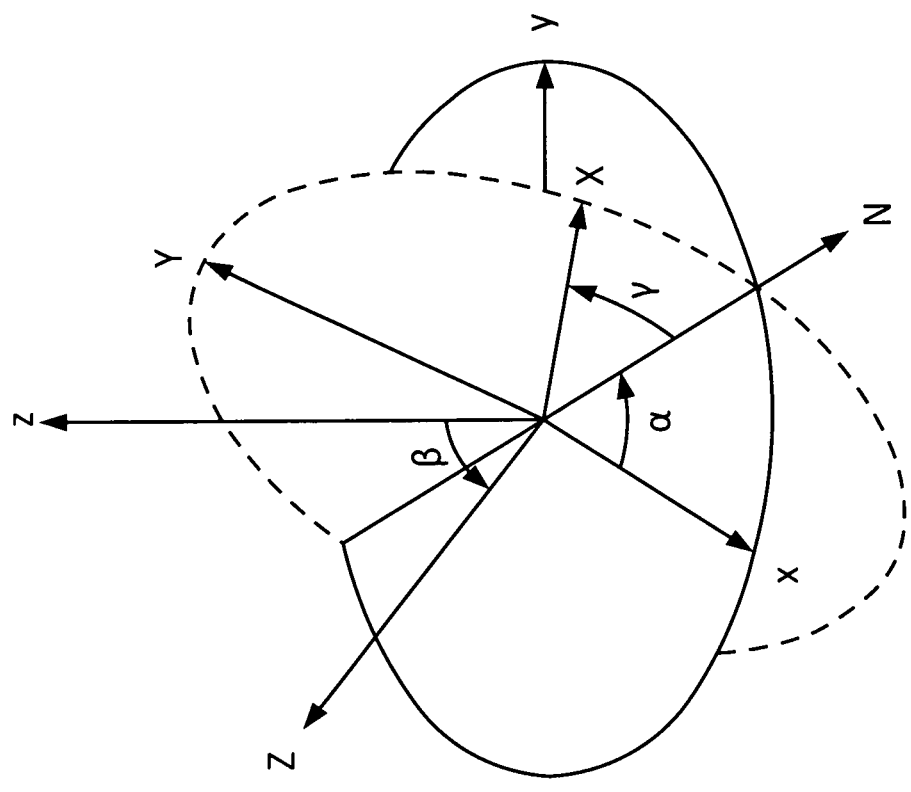
FIG. 5 is a graphical representation of Euler angles.

FIG. 5 is a graphical illustration of Euler angles. Euler angles are a system, introduced by Swiss mathematician Leonhard Euler, to define the orientation of a body with respect to a fixed coordinate system. The orientation is defined by three successive rotations about angles α, β, and γ.

As applied to acoustic wave devices, XYZ is a three-dimensional coordinate system aligned with the crystalline axes of the piezoelectric material. xyz is a three-dimensional coordinate system aligned with the acoustic wave device, where the z axis is normal to the surface of the piezoelectric material. xy is the plane of the surface of the piezoelectric material. In acoustic wave devices excited by an IDT, the x axis is usually defined as normal to the fingers of an IDT and the y axis is usually defined as parallel to the fingers of the IDT. In this case, the electric field is primarily along the x axis. In most devices excited by an IDT, there will be components of the electric field along the y axis (e.g. at the ends of the IDT fingers) and the z axis (e.g. under the fingers of the IDT). The vector N is the intersection of the xy and XY planes. The vector N is also the common perpendicular to the z and Z axis.

The electric field applied to a piezoelectric material can be described by a three-element vector, where the elements of the vector are the electric field components along the X, Y, and Z crystalline axes. The stress introduced in a piezoelectric material by an applied electric field can be determined by multiplying the electric field vector by a matrix of piezoelectric coefficients. When the xyz axes of a physical acoustic wave device are rotated with respect to the XYZ axes of the piezoelectric material, the piezoelectric coefficients depend on the rotation angles.

Although application Ser. No. 16/230,443 and application Ser. No. 16/381,141 are not limited to a specific type or orientation of a piezoelectric material, all of the examples in those applications use Lithium Tantalate or Lithium Niobate piezoelectric plates with the Z crystalline axis normal to the plate surface and the Y crystalline axis orthogonal to the IDT fingers. Such piezoelectric plates have Euler angles of [0°, 0°, 90°].

Figure 6:
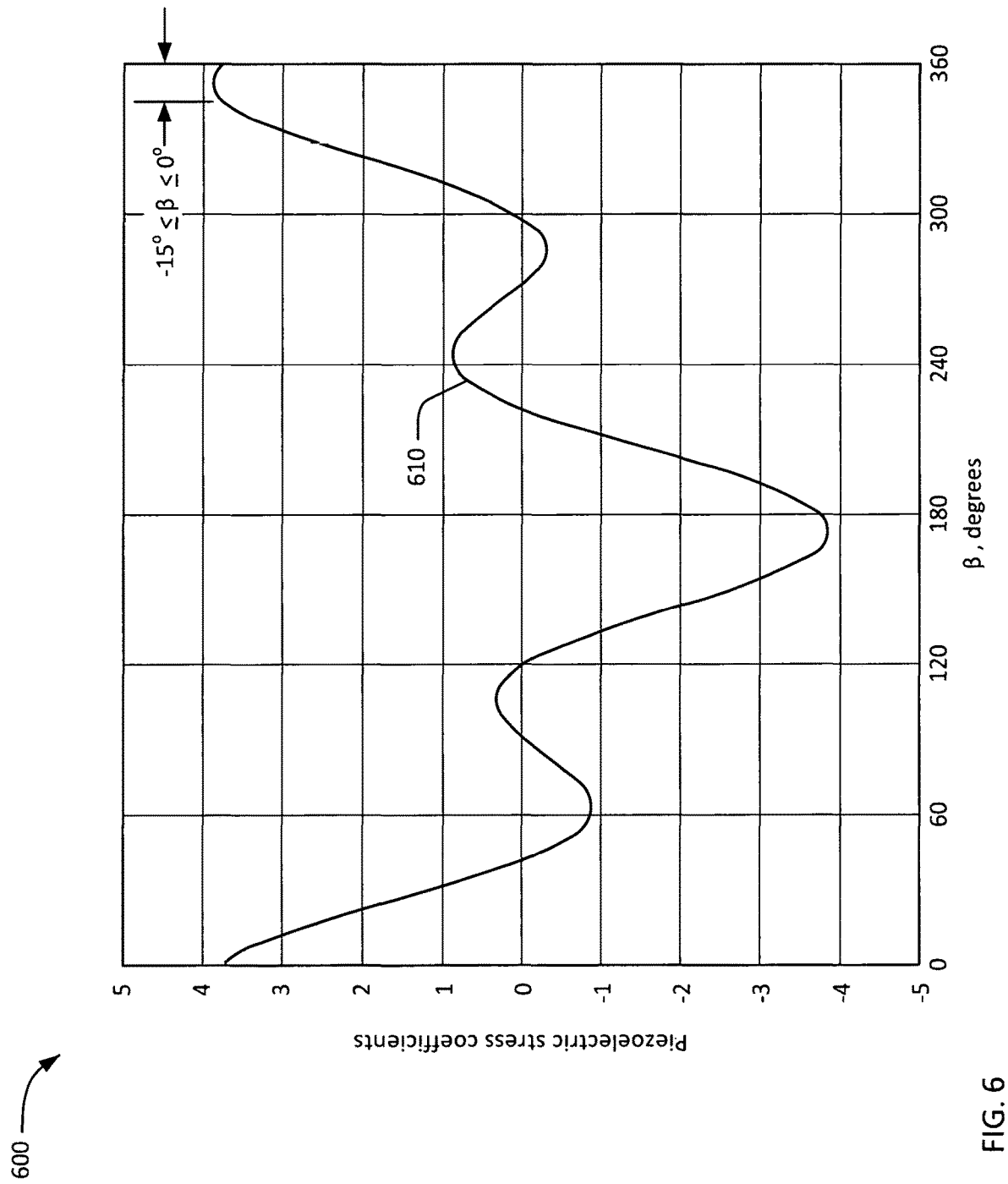
FIG. 6 is a chart of the e24 piezoelectric coefficient of a lithium niobate plate with Euler angles [0°, β, 0°] as a function of β.

FIG. 6 is a graph 600 of piezoelectric coefficient e24 relating electric field along the Y axis to shear stress or torque about the $\varepsilon_{yz}$ axis for lithium niobate plates with Euler angles of [0°, (3, 0°]. The solid line 610 is a plot of this piezoelectric coefficient as a function of the Euler angle β. Shear stress or torque $\varepsilon_{yz}$ excites the primary shear acoustic mode shown in FIG. 4. Inspection of FIG. 6 shows that the piezoelectric stress coefficient is high over a range −15°≤β<0°. The piezoelectric coefficient e24 reaches a highest value of about 3.9 at β=−7.5°.

Application Ser. No. 16/518,594 describes XBAR devices on piezoelectric plates with Euler angles [0°, 90°], where −15°≤β≤0°. As an inferred from FIG. 6, such XBAR devices have higher piezoelectric coupling than devices on piezoelectric plates with Euler angles of [0°, 0°, 90°]. For example, the electromechanical coupling coefficient is 0.263 for 13 equal to −7.5°, as compared to a value of about 0.243 for β=0°.

This patent is directed to XBAR devices on lithium niobate plates having Euler angles [0°, β, 0°]. For historical reasons, this plate configuration is commonly referred to as "Y-cut", where the "cut angle" is the angle between the y axis and the normal to the plate. The "cut angle" is equal to +90°. For example, a plate with Euler angles [0°, 30°, 0°] is commonly referred to as "120° rotated Y-cut".

Figure 7:
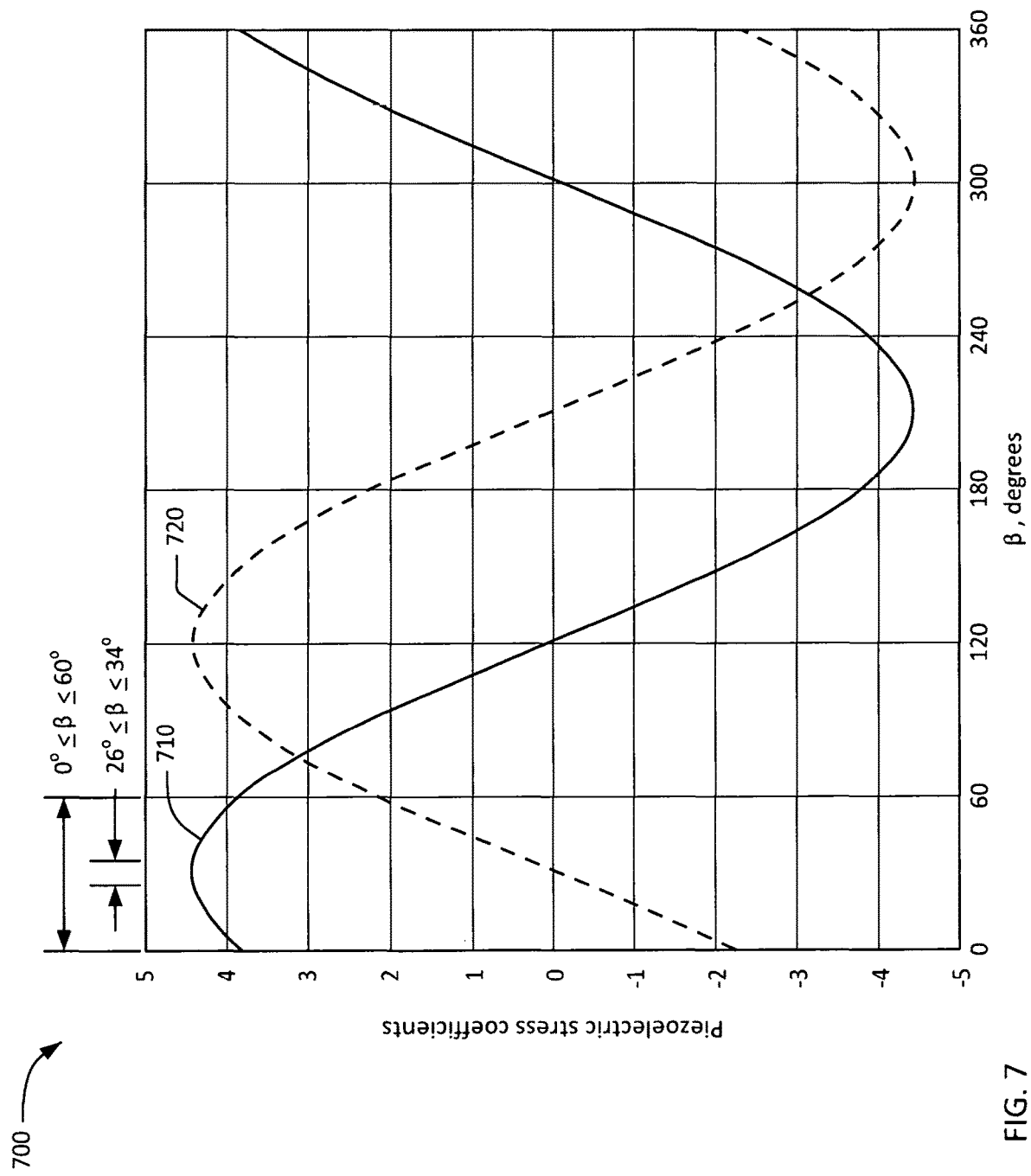
FIG. 7 is a chart of the e14 and e15 piezoelectric coefficients of a lithium niobate plate with Euler angles [0°, β, 0°] as functions of ρ.

FIG. 7 is a graph 700 of two piezoelectric coefficients e15 and e16 for lithium niobate plates having Euler angles [0°, β, 0°]. The solid line 710 is a plot of piezoelectric coefficient e15 relating electric field along the x axis to shear stress or torque εxz axis as a function of β. This shear stress excites the shear primary acoustic mode shown in FIG. 4. The dashed line 720 is a plot of piezoelectric coefficient e16 relating electric field along the x axis to shear stress or torque εxy as a function of β. This shear stress excites horizontal shear modes (e.g. the SH0 plate mode) with atomic displacements normal to the plane of FIG. 4, which are undesired parasitic modes in an XBAR. Note that these two curves are identical and shifted by 90°, (as y-axis shifted from x-axis).

Inspection of FIG. 7 shows that the first piezoelectric stress coefficient is highest for Euler angle β about 30°. The first piezoelectric stress coefficient is higher than about 3.8 (the highest piezoelectric stress coefficient for an unrotated Z-cut lithium niobate) for 0°≤β≤60°. The second piezoelectric stress coefficient is zero for Euler angle β about 30°, where the first piezoelectric stress coefficient is maximum. In this context "about 30°" means "within a reasonable manufacturing tolerance of 30°". The second piezoelectric stress coefficient is less than about 10% of the first piezoelectric stress coefficient for 26°≤β≤34°.

Figure 8:
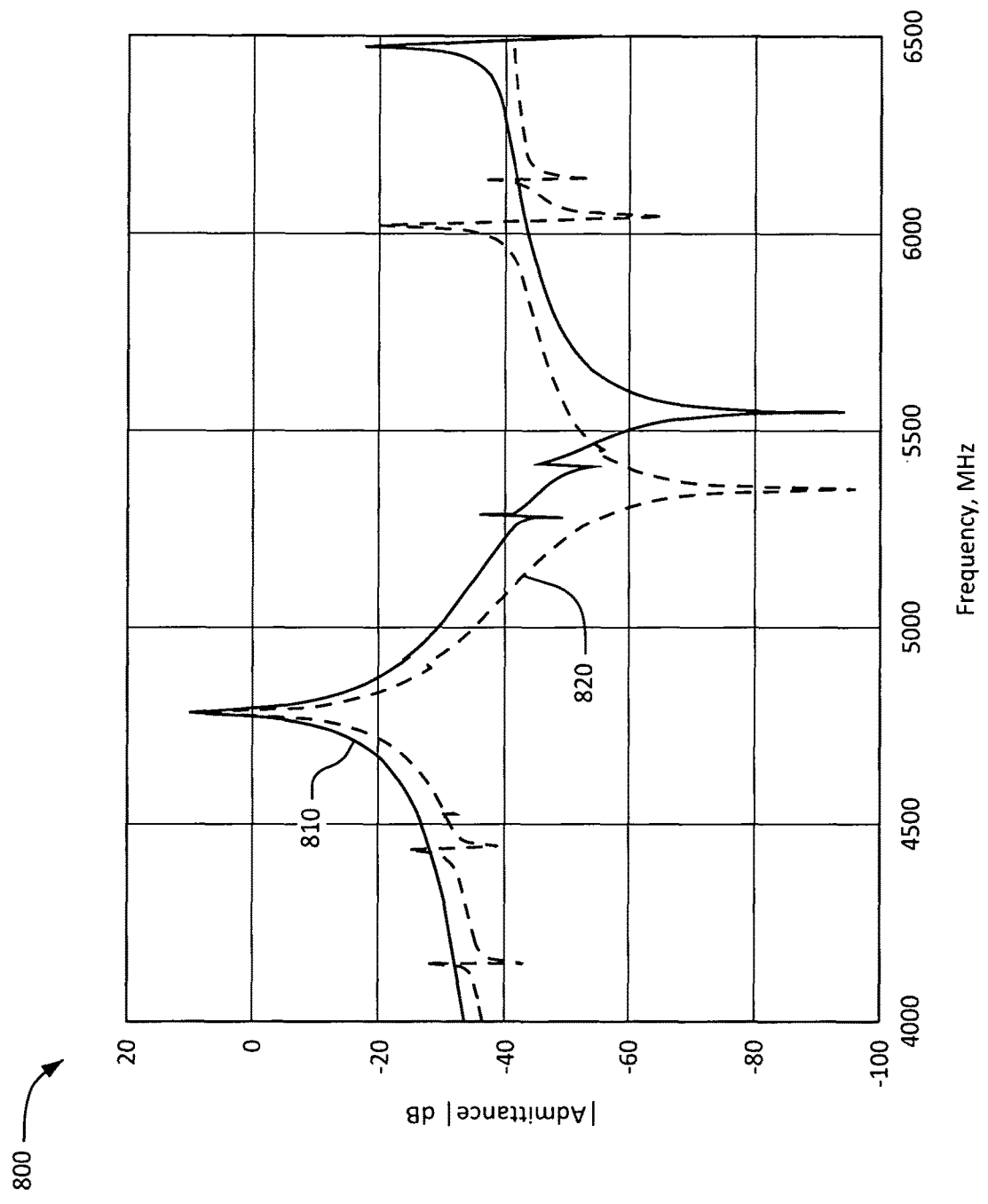
FIG. 8 is a chart comparing the admittances of XBARs formed on rotated Y-X lithium niobate and Z cut lithium niobate.

FIG. 8 is a chart 800 showing the normalized magnitude of the admittance (on a logarithmic scale) as a function of frequency for two XBAR devices simulated using finite element method (FEM) simulation techniques. The dashed line 820 is a plot of the admittance on an XBAR on a Z-cut lithium niobate plate. In this case the Z crystalline axis is orthogonal to the surfaces of the plate, the electric field is applied along the Y crystalline axis, and the Euler angles of the piezoelectric plate are 0, 0, 90°. The solid line 810 is a plot of the admittance of an XBAR on a 120° Y-cut lithium niobate plate. In this case, the electric field is applied along the crystalline X axis, which lies in the plane of the surfaces of the lithium niobate plate. The YZ plane is normal to the surfaces of the plate. The Z crystalline axis is inclined by 30° with respect to orthogonal to the surfaces of the plate and the Euler angles of the piezoelectric plate are 0°, 30°, 0°. In both cases, the plate thickness is 400 nm, and the IDT fingers are aluminum 100 nm thick. The substrate supporting the piezoelectric plate is silicon with a cavity formed under the IDT fingers.

The difference between anti-resonance and resonance frequencies of the resonator on the rotated Y-cut plate (solid line 810) is about 200 MHz greater than the difference between anti-resonance and resonance frequencies of the resonator on the Z-cut plate (dashed line 820). The electromechanical coupling of the XBAR on the rotated Y-cut plate is about 0.32; the electromechanical coupling of the XBAR on the Z-cut plate is about 0.24.

Figure 9:
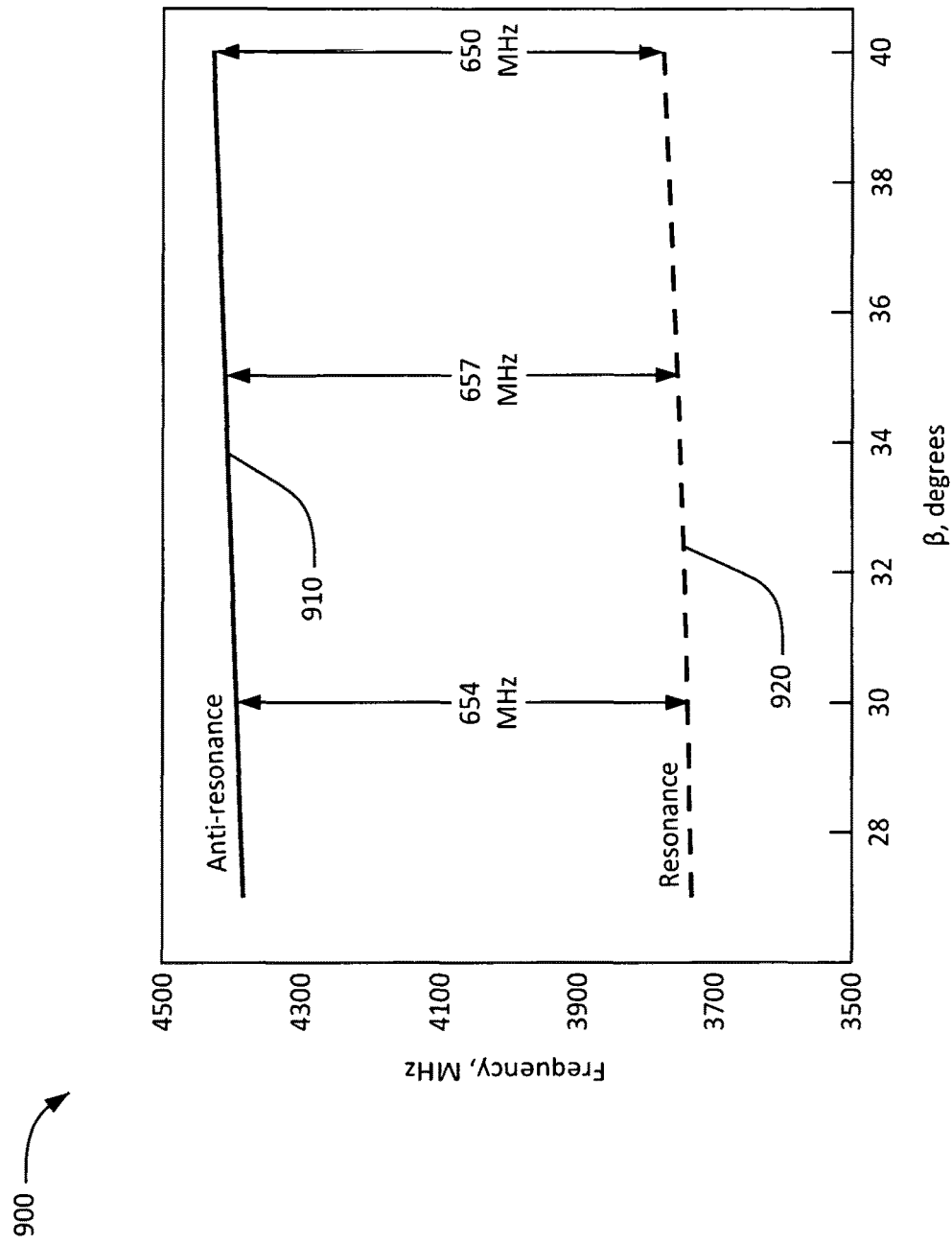
FIG. 9 is a chart of the resonance and anti-resonance frequencies of an XBAR on rotated Y-X lithium niobate as functions of Z-axis tilt angle β.

FIG. 9 is a chart 900 comparing the anti-resonance and resonance frequencies of XBAR resonators on lithium niobate plates having Euler angles 0°, β, 0°. The lithium niobate plate thickness is 500 nm. The solid line 910 is a plot of anti-resonance frequency as a function of β. The dashed lint 920 is a plot of resonance frequency as a function of β. Consideration of the plots shows that a both resonance and anti-resonance frequencies have a slight dependence on β and the difference between the resonance and anti-resonance frequencies is reasonably constant over the range 27°≤β≤40°.

Figure 10:
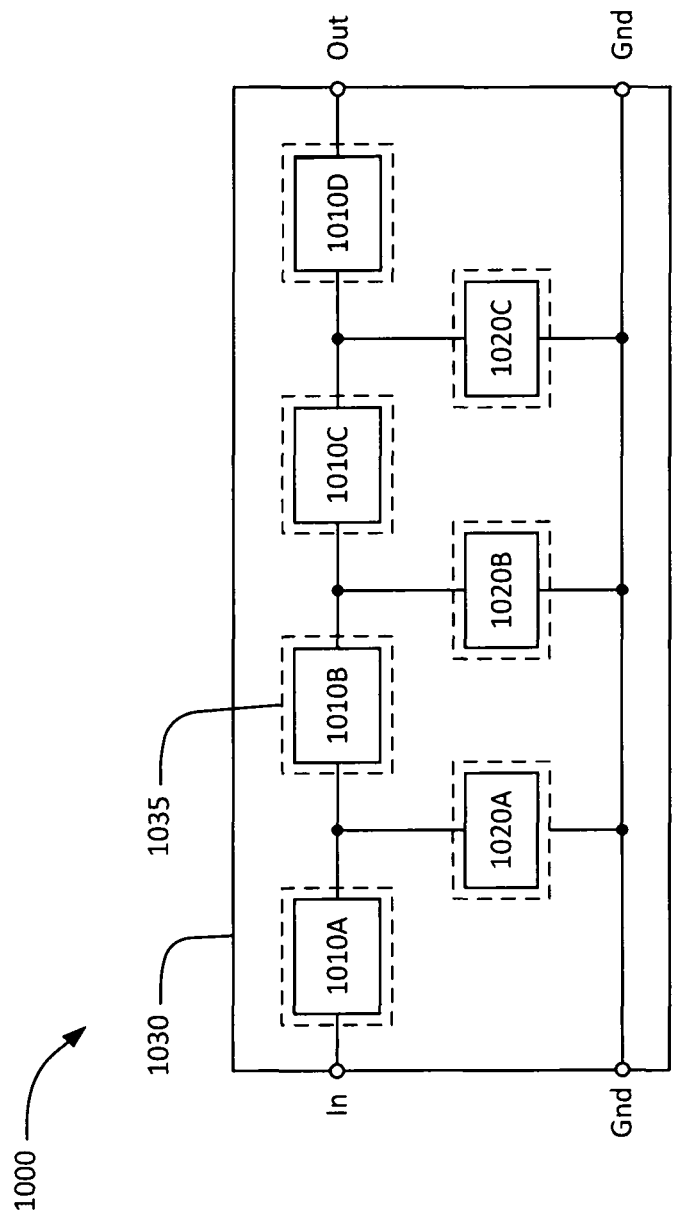
FIG. 10 is a simplified schematic circuit diagram of a bandpass filter using XBARs.

FIG. 10 is a schematic circuit diagram for an exemplary high frequency band-pass filter 1000 using XBARs. The filter 1000 has a conventional ladder filter architecture including four series resonators 1010A, 1010B, 1010C, 1010D and three shunt resonators 1020A, 1020B, 1020C. The four series resonators 1010A, 1010B, 1010C and 1010D are connected in series between a first port and a second port. In FIG. 10, the first and second ports are labeled "In" and "Out", respectively. However, the filter 1000 is symmetrical and either port and serve as the input or output of the filter. The three shunt resonators 1020A, 1020B, 1020C are connected from nodes between the series resonators to ground. All the shunt resonators and series resonators in this example are XBARs.

The four series resonators 1010A, B, C, D and the three shunt resonators 1020A, B, C of the filter 1000 may be formed on a single plate 1030 of piezoelectric material bonded to a silicon substrate (not visible). Each resonator includes a respective IDT (not shown) with least the fingers of each IDT are disposed over a cavity in the substrate. In FIG. 10, the cavities are illustrated schematically as the dashed rectangles (such as the rectangle 1035). In this example, each IDT is disposed over a respective cavity. In this and similar contexts, the term "respective" means "relating things each to each", which is to say with a one-to-one correspondence. In other filters, the IDTs of two or more resonators may be disposed over a common cavity.

A similar filter could be designed using SM XBARs. When the resonators are SM XBARs, the IDTs are disposed over an acoustic Bragg reflector as shown in FIG. 3.

Figure 11:
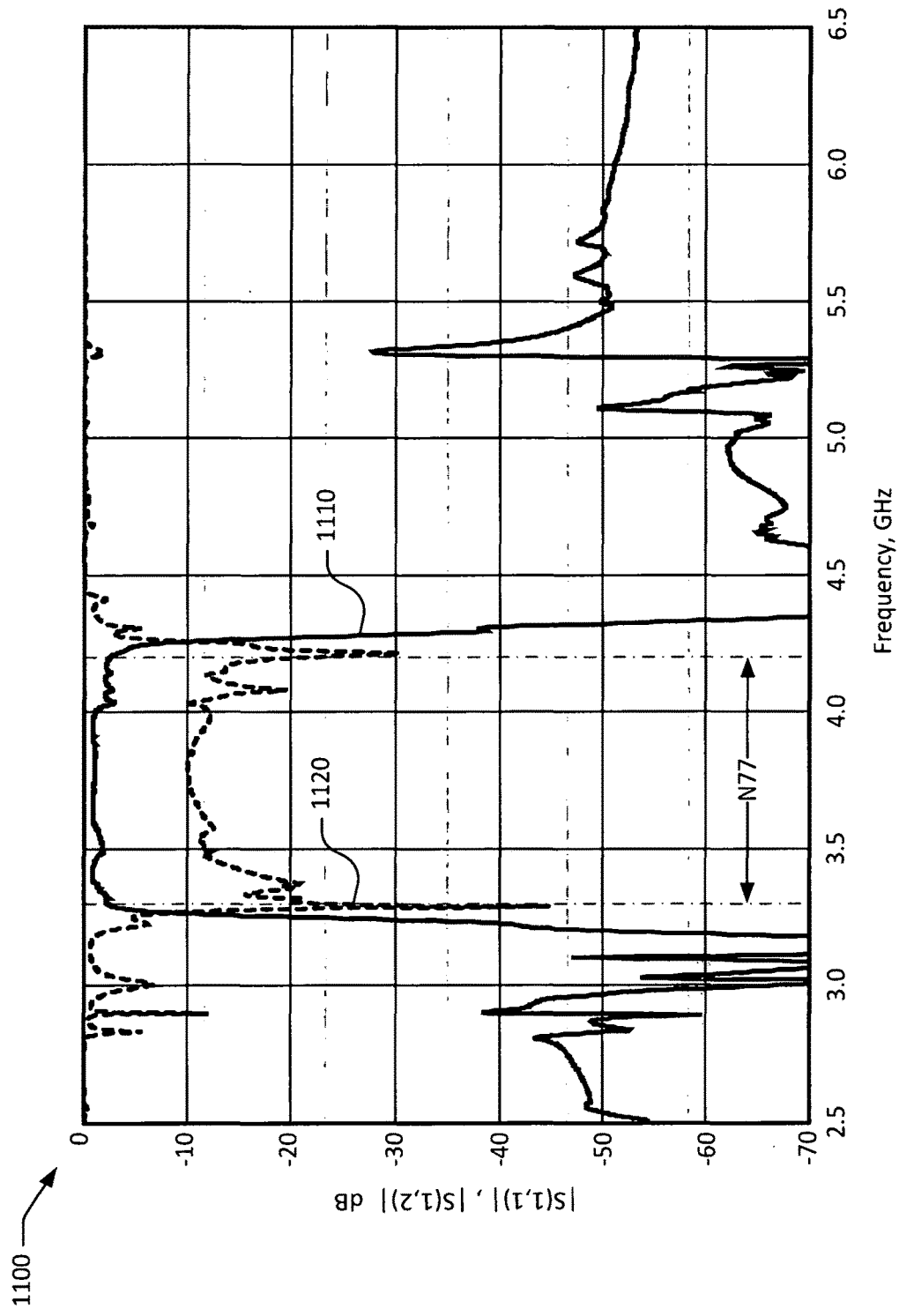
FIG. 11 is a chart of the transmission through, and the return reflection from, an embodiment of the bandpass filter of FIG. 9.

FIG. 11 is a chart 1100 showing simulated performance of an embodiment of the band-pass filter 1100. The XBARs are formed on a 128° Y-cut lithium niobate plate Euler angles 0°, 38°, 0°). The thickness is of the lithium niobate plate is 500 nm. The substrate is silicon, the IDT conductors are aluminum, the front-side dielectric, where present, is SiO2. The thickness tm of the IDT fingers is 650 nm, such that tm/ts=1.30. The other physical parameters of the resonators are provided in the following table (all dimensions are in microns; p=IDT pitch, w=IDT finger width, and tfd=front-side dielectric thickness):

| Parameter | Series Resonators | | | | Shunt Resonators | | |
| --- | --- | --- | --- | --- | --- | --- | --- |
| | X1 | X3 | X5 | X7 | X2 | X4 | X6 |
| p | 3.43 | 3.45 | 3.47 | 3.02 | 5.44 | 5.04 | 5.18 |
| w | 1.14 | 1.16 | 1.18 | 1.14 | 1.10 | 1.14 | 1.12 |
| tfd | 0 | 0 | 0 | 0 | 0.17 | 0.17 | 0.17 |

In FIG. 11, the solid line 1110 is a plot of S(1,2), which is the input-output transfer function of the filter, as a function of frequency. The dashed line 1120 is a plot of S(1,1), which is the reflection at the input port, as a function of frequency. The dash-dot vertical lines delimit band N77 from 3.3 to 4.2 GHz. Both plots 1110, 1120 are based on circuit simulation using finite element methods to model the resonators.

Description of Methods

Figure 12:
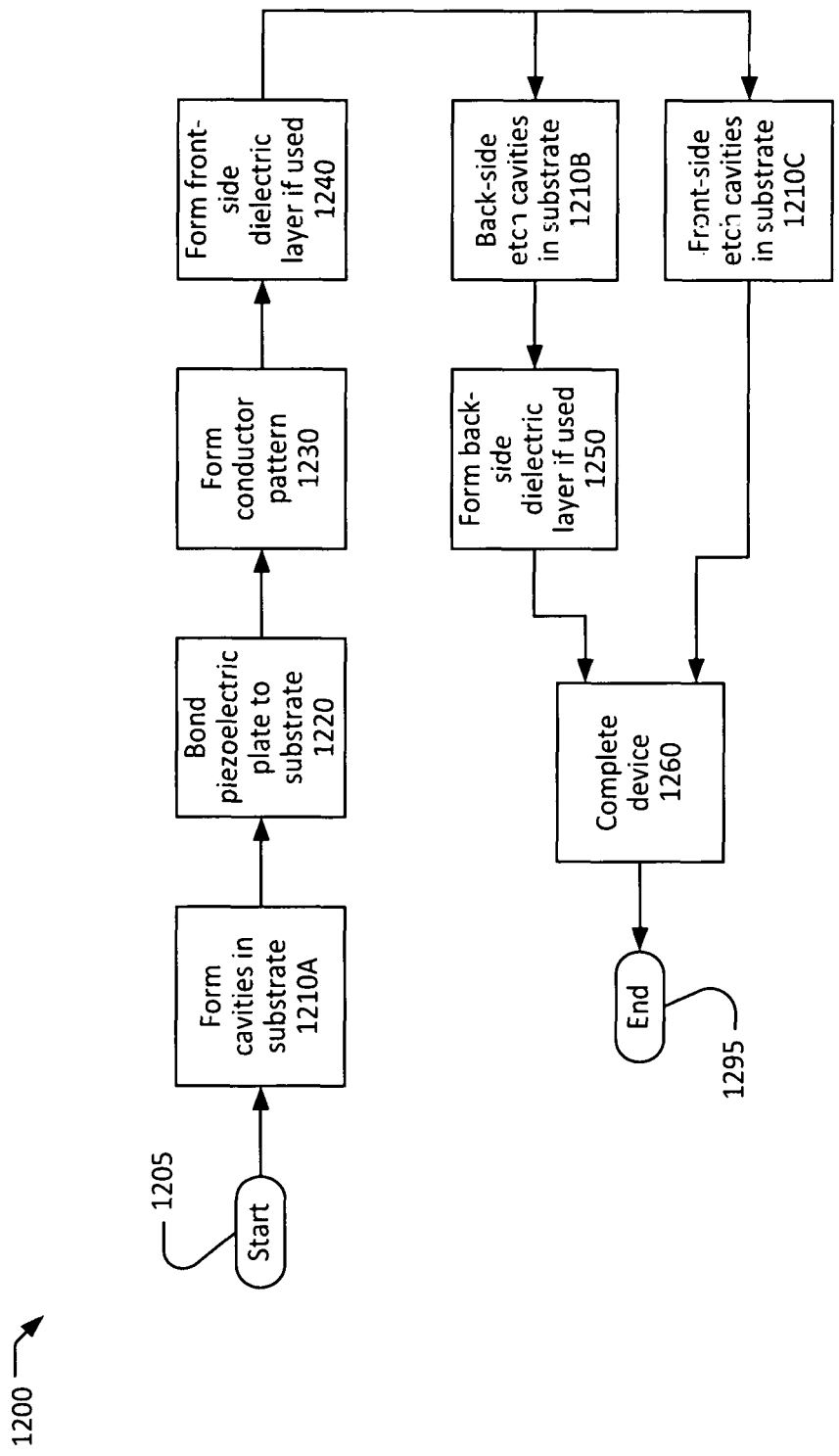
FIG. 12 is a flow chart of a process for fabricating an XBAR.

FIG. 12 is a simplified flow chart showing a process 1200 for making an XBAR or a filter incorporating XBARs. The process 1200 starts at 1205 with a substrate and a plate of piezoelectric material and ends at 1295 with a completed XBAR or filter. The flow chart of FIG. 12 includes only major process steps. Various conventional process steps (e.g. surface preparation, cleaning, inspection, baking, annealing, monitoring, testing, etc.) may be performed before, between, after, and during the steps shown in FIG. 12.

The flow chart of FIG. 12 captures three variations of the process 1200 for making an XBAR which differ in when and how cavities are formed in the substrate. The cavities may be formed at steps 1210A, 1210B, or 1210C. Only one of these steps is performed in each of the three variations of the process 1200.

The piezoelectric plate may be, for example, rotated Y-cut lithium niobate. The Euler angles of the piezoelectric plate are [0°, β, 0°], where β is in the range from 0° to 60°. Preferably, β may be in the range from 26° to 34° to minimize coupling into hear horizontal acoustic modes. β may be about 30°. The substrate may preferably be silicon. The substrate may be some other material that allows formation of deep cavities by etching or other processing.

In one variation of the process 1200, one or more cavities are formed in the substrate at 1210A, before the piezoelectric plate is bonded to the substrate at 1220. A separate cavity may be formed for each resonator in a filter device. The one or more cavities may be formed using conventional photolithographic and etching techniques. Typically, the cavities formed at 1210A will not penetrate through the substrate.

At 1220, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1230 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1230 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1230 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1240, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1200, one or more cavities are formed in the back side of the substrate at 1210B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 1200, a back-side dielectric layer may be formed at 1250. In the case where the cavities are formed at 1210B as holes through the substrate, the back-side dielectric layer may be deposited through the cavities using a conventional deposition technique such as sputtering, evaporation, or chemical vapor deposition.

In a third variation of the process 1200, one or more cavities in the form of recesses in the substrate may be formed at 1210C by etching the substrate using an etchant introduced through openings in the piezoelectric plate. A separate cavity may be formed for each resonator in a filter device.

In all variations of the process 1200, the filter device is completed at 1260. Actions that may occur at 1260 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1260 is to tune the resonant frequencies of the resonators within the device by adding or removing metal or dielectric material from the front side of the device. After the filter device is completed, the process ends at 1295.

Figure 13:
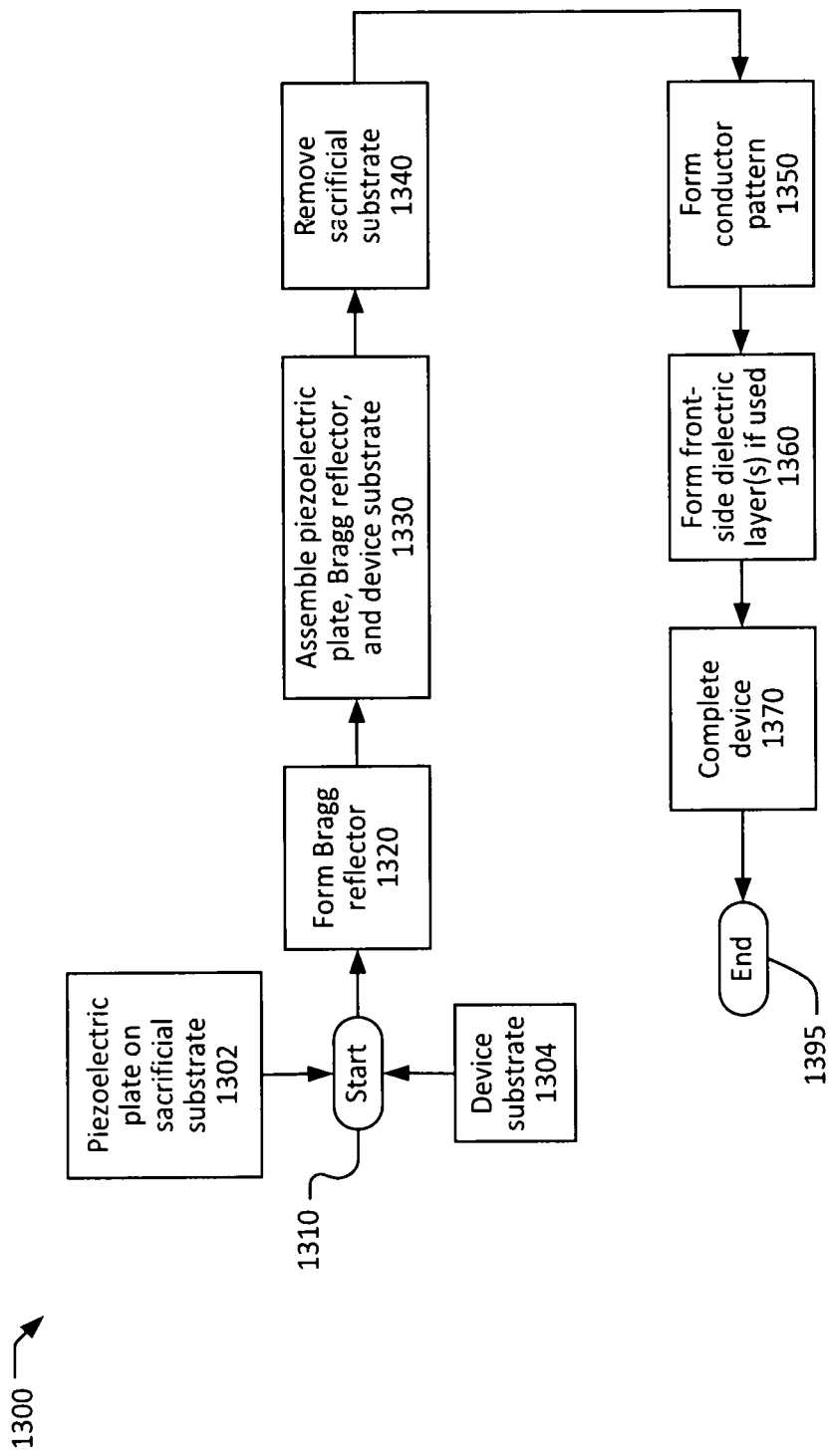
FIG. 13 is a flow chart of a process for fabricating a solidly mounted XBAR.

FIG. 13 is a simplified flow chart of a method 1300 for making a SM XBAR or a filter incorporating SM XBARs. The method 1300 starts at 1310 with a thin piezoelectric plate disposed on a sacrificial substrate 1302 and a device substrate 1304. The method 1300 ends at 1395 with a completed SM XBAR or filter. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

The piezoelectric plate 1302 may be, for example, rotated Y-cut lithium niobate. The Euler angles of the piezoelectric plate are [0°, β, 0°], where β is in the range from 0° to 60°. Preferably, 13 may be in the range from 26° to 34° to minimize coupling to shear horizontal modes. β may be about 30°

At 1320, an acoustic Bragg reflector is formed by depositing alternating dielectric layers of high acoustic impedance and low acoustic impedance materials. Each of the layers has a thickness equal to or about one-fourth of the acoustic wavelength. Dielectric materials having comparatively low acoustic impedance include silicon dioxide, carbon-containing silicon oxide, and certain plastics such as cross-linked polyphenylene polymers. Dielectric materials having comparatively high acoustic impedance include silicon nitride and aluminum nitride. All of the high acoustic impedance layers are not necessarily the same material, and all of the low acoustic impedance layers are not necessarily the same material. The total number of layers in the acoustic Bragg reflector may be from about five to more than twenty.

At 1320, all of the layers of the acoustic Bragg reflector may be deposited on either the surface of the piezoelectric plate on the sacrificial substrate 1302 or a surface of the device substrate 1304. Alternatively, some of the layers of the acoustic Bragg reflector may be deposited on the surface of the piezoelectric plate on the sacrificial substrate 1302 and the remaining layers of the acoustic Bragg reflector may be deposited on a surface of the device substrate 1304.

At 1330, the piezoelectric plate on the sacrificial substrate 1302 and the device substrate 1304 may be bonded such that the layers of the acoustic Bragg reflector are sandwiched between the piezoelectric plate and the device substrate. The piezoelectric plate on the sacrificial substrate 1302 and the device substrate 1304 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1302 and the device substrate 1304 may be bonded, the sacrificial substrate, and any intervening layers, are removed at 1340 to expose the surface of the piezoelectric plate (the surface that previously faced the sacrificial substrate). The sacrificial substrate may be removed, for example, by material-dependent wet or dry etching or some other process.

A conductor pattern, including IDTs of each SM XBAR, is formed at 1350 by depositing and patterning one or more conductor layer on the surface of the piezoelectric plate that was exposed when the sacrificial substrate was removed at 1340. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1350 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1350 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1360, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and optional front-side dielectric layer are formed at 1350 and 1360, the filter device may be completed at 1370. Actions that may occur at 1370 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1370 is to tune the resonant frequencies of the resonators within the device by adding or removing metal or dielectric material from the front side of the device. After the filter device is completed, the process ends at 1395.

A variation of the process 1300 starts with a single-crystal piezoelectric wafer at 1302 instead of a thin piezoelectric plate on a sacrificial substrate of a different material. Ions are implanted to a controlled depth beneath a surface of the piezoelectric wafer (not shown in FIG. 13). The portion of the wafer from the surface to the depth of the ion implantation is (or will become) the thin piezoelectric plate and the balance of the wafer is the sacrificial substrate. The acoustic Bragg reflector is formed at 1320 as previously described and the piezoelectric wafer and device substrate are bonded at 1330 such that the acoustic Bragg reflector is disposed between the ion-implanted surface of the piezoelectric wafer 1302 and the device substrate 1304. At 1340, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
a substrate having a surface;
a lithium niobate plate, wherein Euler angles of the lithium niobate plate are [0°, β, 0°], where β is greater than or equal to 0° and less than or equal to 60°;
an acoustic Bragg reflector between the surface of the substrate and the lithium niobate plate; and
an interdigital transducer (IDT) at the lithium niobate plate, wherein at least one finger of the IDT extends in a groove in the lithium niobate plate,
wherein the groove has a depth in the lithium niobate plate that is less than or equal to a thickness of the at least one finger of the IDT.

2. The device of claim 1, wherein the IDT and the lithium niobate plate are configured such that a radio frequency signal applied to the IDT excites a shear primary acoustic mode within the lithium niobate plate, wherein a direction of acoustic energy flow of the shear primary acoustic mode is substantially orthogonal to front and back surfaces of the lithium niobate plate.

3. The device of claim 1, wherein the IDT comprises a plurality of fingers that all extend in respective grooves in the lithium niobate plate.

4. The device of claim 1, wherein a depth of the groove is less than or equal to a thickness of the lithium niobate plate.

5. The device of claim 1, wherein is greater than or equal to 26° and less than or equal to 34°.

6. The device of claim 1, wherein the acoustic Bragg reflector comprises a plurality of layers alternating between high acoustic impedance layers and low acoustic impedance layers, wherein the high acoustic impedance layers are one of silicon nitride and aluminum nitride, and the low acoustic impedance layers are carbon-containing silicon oxide.

7. The device of claim 1, further comprising a front-side dielectric layer at the lithium niobate plate over and/or between the fingers of the IDT.

8. A filter device, comprising:
a substrate;
a lithium niobate plate, wherein Euler angles of the lithium niobate plate are [0°, β, 0°], where β is greater than or equal to 0° and less than or equal to 60°;
an acoustic Bragg reflector between the substrate and the lithium niobate plate; and
a conductor pattern at the lithium niobate plate, the conductor pattern including a plurality of interdigital transducers (IDTs) of a respective plurality of acoustic resonators that each have interleaved fingers at the lithium niobate plate,
wherein at least one finger of at least one of the plurality of IDTs extends in a groove in the lithium niobate plate, and
wherein the groove has a depth in the lithium niobate plate that is less than or equal to a thickness of the at least one finger.

9. The device of claim 8, wherein the each of the plurality of IDTs and the lithium niobate plate are configured such that a radio frequency signal applied to the each of the plurality of IDTs excites a shear primary acoustic mode within the lithium niobate plate, wherein a direction of acoustic energy flow of the shear primary acoustic mode is substantially orthogonal to front and back surfaces of the lithium niobate plate.

10. The device of claim 8, wherein the at least one of the plurality of IDTs comprises a plurality of fingers that all extend in respective grooves in the lithium niobate plate.

11. The device of claim 8, wherein a depth of the groove is less than or equal to a thickness of the lithium niobate plate.

12. The device of claim 8, wherein β is greater than or equal to 26° and less than or equal to 34°.

13. The device of claim 8, wherein the acoustic Bragg reflector comprises a plurality of layers alternating between high acoustic impedance layers and low acoustic impedance layers, wherein the high acoustic impedance layers are one of silicon nitride and aluminum nitride, and the low acoustic impedance layers are carbon-containing silicon oxide.

14. The device of claim 8, further comprising a front-side dielectric layer at the lithium niobate plate over and/or between the fingers of at least one of the plurality of IDTs.

15. A method of fabricating an acoustic resonator device, comprising:
forming an acoustic Bragg reflector by depositing material layers on one or both of a surface of a device substrate and a lithium niobate plate attached to a sacrificial substrate, wherein Euler angles of the lithium niobate plate are [0°, β, 0°], where β is greater than or equal to 0° and less than or equal to 60°;
bonding the lithium niobate plate to the device substrate such that layers of the acoustic Bragg reflector are between the lithium niobate plate and the surface of the device substrate;
removing the sacrificial substrate to expose the lithium niobate plate; and
forming an interdigital transducer (IDT) at the lithium niobate, wherein at least one finger of the IDT extends in a groove in the lithium niobate plate,
wherein the groove has a depth in the lithium niobate plate that is less than or equal to a thickness of the at least one finger of the IDT.

16. The method of claim 15, wherein the IDT and the lithium niobate plate are configured such that a radio frequency signal applied to the IDT excites a shear primary acoustic mode within the lithium niobate plate, wherein a direction of acoustic energy flow of the shear primary acoustic mode is substantially orthogonal to front and back surfaces of the lithium niobate plate.

17. The method of claim 15, further comprising forming the IDT to comprise a plurality of fingers that all extend in respective grooves in the lithium niobate plate.

18. The method of claim 15, wherein a depth of the groove is less than or equal to a thickness of the lithium niobate plate.

19. The method of claim 15, wherein is greater than or equal to 26° and less than or equal to 34°.

20. The method of claim 15, wherein the acoustic Bragg reflector comprises a plurality of layers alternating between high acoustic impedance layers and low acoustic impedance layers, wherein the high acoustic impedance layers are one of silicon nitride and aluminum nitride, and the low acoustic impedance layers are carbon-containing silicon oxide.

21. The method of claim 15, further comprising forming a front-side dielectric layer at the lithium niobate plate over and/or between the fingers of the IDT.

* * * * *